United States Patent
Raj et al.

(10) Patent No.: US 9,916,892 B1
(45) Date of Patent: Mar. 13, 2018

(54) WRITE DRIVER CIRCUITRY TO REDUCE LEAKAGE OF NEGATIVE BOOST CHARGE

(71) Applicant: QUALCOMM Incorporated, San Diego, CA (US)

(72) Inventors: Pradeep Raj, Bangalore (IN); Rahul Sahu, Bangalore (IN); Mukund Narasimhan, Bangalore (IN); Fahad Ahmed, San Diego, CA (US); Chulmin Jung, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/448,526

(22) Filed: Mar. 2, 2017

(51) Int. Cl.
  *G11C 11/419* (2006.01)
  *G11C 5/14* (2006.01)
  *G11C 11/412* (2006.01)

(52) U.S. Cl.
  CPC .............. *G11C 11/419* (2013.01); *G11C 5/14* (2013.01); *G11C 5/147* (2013.01); *G11C 11/412* (2013.01)

(58) Field of Classification Search
  CPC ......... G11C 11/419; G11C 5/14; G11C 5/147; G11C 11/412
  USPC .......... 356/156, 154, 189.09, 189.06, 189.16
  See application file for complete search history.

(56) References Cited

U.S. PATENT DOCUMENTS

| | | | |
|---|---|---|---|
| 8,363,453 B2 | 1/2013 | Arsovski et al. | |
| 8,441,874 B2 | 5/2013 | Sinha et al. | |
| 9,070,432 B2 | 6/2015 | Hsieh et al. | |
| 9,496,025 B2 | 11/2016 | Chandra et al. | |
| 9,847,119 B2 * | 12/2017 | Chandra | G11C 11/419 |
| 2014/0112062 A1 | 4/2014 | Trivedi et al. | |

* cited by examiner

*Primary Examiner* — Jason Lappas
(74) *Attorney, Agent, or Firm* — Haynes and Boone, LLP

(57) ABSTRACT

A pair of write driver inverters are arranged in series to drive a bit line responsive to a data bit input signal. A first boost capacitor provides a negative boost to a first ground node for a first one of the write driver inverters during the write assist period. A second boost capacitor provides a negative boost to a second ground node for a second one of the write driver inverters during the write assist period.

17 Claims, 3 Drawing Sheets

US 9,916,892 B1

WRITE DRIVER CIRCUITRY TO REDUCE LEAKAGE OF NEGATIVE BOOST CHARGE

TECHNICAL FIELD

This application relates to memories, and more particularly to a memory having write driver circuitry adapted to reduce leakage of negative boost charge during a write assist period.

BACKGROUND

A static random access memory (SRAM) bitcell includes a pair of cross-coupled inverters. Depending upon the binary state of a stored data bit, a p-type metal oxide semiconductor (PMOS) transistor in one of the inverters may charge a true (Q) data node. Similarly, a PMOS transistor in a remaining one of the cross-coupled inverters may charge a complement (QB) data node depending the binary state of the stored data bit. The Q data node couples through a first n-type metal oxide semiconductor (NMOS) access transistor to a bit line whereas the QB data node couples through a second NMOS access transistor to a complement bit line. During a write operation in which the binary content of the bitcell is changed, one of the PMOS transistors will initially be on and charging its data node while an access transistor is attempting to discharge the same data node through the corresponding grounded bit or complement bit line. The access transistor must thus be relatively strong with regard to the PMOS transistor so that the data node can be discharged relatively quickly. To provide this strength, the access transistors may be relatively large as compared to the inverter PMOS transistors. But increasing the size of the access transistors reduces density for the resulting SRAM.

To strengthen the access transistors without such a loss in density, it is thus conventional to provide a negative boost voltage on the otherwise-grounded bit line during the write operation. This negative boost voltage is applied during a write assist period to increase the strength of the access transistor in comparison to the inverter PMOS transistor so that the access transistor can quickly discharge the corresponding data node yet each access transistor may remain relatively small to enhance density. The negative boost voltage is applied during the write assist period through a boost capacitor. But the charge on the boost capacitor is partially discharged to ground at the termination of the write assist period through the write driver.

This discharge of the boost capacitor charge may be better appreciated with regard to a conventional memory 100 shown in FIG. 1. A write driver inverter 115 is in series with another write driver inverter 105. An output of write driver inverter 105 drives a true bit line whereas the data bit input signal (data) drives an input of write driver inverter 115. Write driver inverter 105 includes a p-type metal oxide semiconductor (PMOS) transistor P1 having a source connected to a power supply voltage node supplying a power supply voltage VDD. A drain of transistor P1 connects to a drain of an n-type metal oxide semiconductor (NMOS) transistor M1. The drain nodes for transistors P1 and M1 (the output node for inverter 105) are coupled to the bit line. Similarly, the gates of transistors P1 and M1 from the input node for write driver inverter 105 and are thus connected to the output of write driver inverter 115. The source of transistor M1 connects to ground through an NMOS write assist transistor M3. An inverter 125 inverts a boost enable signal (boost_enb) to drive the gate of write assist transistor M3. In memory 100, the boost enable signal is active high such that it is a binary low value (ground) outside of the write assist period. Prior to the initiation of the write assist period, write assist transistor M3 is thus switched on. Should the data bit have a binary high value, transistor M1 is also switched on such that the true bit line is discharged to ground through transistor M1 and write assist transistor M3.

The output of inverter 125 is delayed through a pair of inverters 130 and 135 in series with inverter 125 to drive an anode of a boost capacitor 140 such as formed by the gate capacitance of a PMOS transistor P3 (both the drain and the source of transistor P3 are connected to the output of inverter 135 to form the anode of boost capacitor 140). The gate of transistor P3 forms the cathode of boost capacitor 140, which is connected to the source for transistor M1. Prior to the initiation of the write assist period, the anode of boost capacitor 140 is charged to the power supply voltage VDD whereas the cathode of boost capacitor 140 is discharged to ground. The assertion (note that as used herein, a signal is deemed to be "asserted" if it is charged high in the case of an active-high signal or discharged in the case of an active-low signal) of the boost enable signal at the initiation of the write assist period is delayed through the pair of inverters 130 and 135 to discharge the anode of boost capacitor 140. The gate capacitance for transistor P3 then pulls its gate voltage below ground to provide a negative write assist voltage boost to the true bit line.

The write driver also includes an write driver inverter 120 in series with another write driver inverter 110. Write driver inverter 120 inverts a complement data bit (data_bar) to drive the input of write driver inverter 110, which is formed by a PMOS transistor P2 in series with an NMOS transistor M2. The source of transistor M2 is tied to the cathode of boost capacitor 140 in common with the source of transistor M1. The output of write driver inverter 110 (the drains of transistors P2 and M2) drives the complement bit line. When the data bit is true, the complement data bit is of course false such that transistor P2 is on and transistor M2 off prior to the write assist period. During the write assist period, the source voltage of transistor M2 is pulled below ground by, for example, as much as half a volt. The gate to source voltage for transistor M2 is thus positive despite the grounding of its gate such that the boost charge from boost capacitor 140 is discharged through transistor M1 and then through transistor P2 into the power supply node at its source. Boost charge is also discharged through the weakly-on transistor M2 into the complement bit line. An analogous discharge through transistor M1 occurs during the write assist period should the data bit input signal be a binary high value. This discharge of the boost charge not only wastes power but also weakens the negative boost for the discharged bit line.

Accordingly, there is a need in the art for memories having an enhanced negative bit line boost with reduced power consumption.

SUMMARY

A memory is provided with a first boost capacitor for providing a negative bit line boost that is applied to a first boost ground node for a first pair of write driver inverters during a write assist period. Depending upon the data bit being written to the memory, one of the write driver inverters in the first pair will ground a corresponding bit line prior to the initiation of the write assist period. The memory also includes a second boost capacitor for providing a negative boost to a second boost ground node for an second pair of write driver inverters. Depending upon the data bit value, one of the write driver inverters in the second pair will ground the input of a corresponding write driver inverter in the first pair prior to the initiation of the write assist period by coupling the input to a second boost ground node. A PMOS transistor in the write driver inverter having the grounded input responds by switching on to charge the corresponding bit line to a power supply voltage while an NMOS transistor in this write driver inverter is switched off by having its gate grounded.

During the write assist period, a voltage for the second boost ground node is given a negative boost by the second boost capacitor while the first boost capacitor provides a negative boost to the first boost ground node for the first pair of write driver inverters. The gate voltage for the NMOS transistor is thus given a negative boost during the write assist period from the second boost ground node. At the same time, a source voltage of the NMOS transistor is given a negative boost from the first boost ground node. The NMOS transistor is thus switched firmly off to prevent a discharge of boost charge from the first boost ground node through the NMOS transistor into the power supply node for the PMOS transistor (and also into the charged bit line).

These and other advantageous features may be better appreciated through the following detailed description.

BRIEF DESCRIPTION OF THE DRAWINGS

Embodiments of the present disclosure and their advantages are best understood by referring to the detailed description that follows. It should be appreciated that like reference numerals are used to identify like elements illustrated in one or more of the figures.

DETAILED DESCRIPTION

A memory is provided with a first boost capacitor for providing a negative bit line boost that is applied to a first boost ground node for a first pair of write driver inverters during a write assist period. Depending upon the data bit being written to the memory, one of the write driver inverters in the first pair will ground a corresponding bit line prior to the initiation of the write assist period. The memory also includes a second boost capacitor for providing a negative boost to a second boost ground node for an second pair of write driver inverters during the write assist period.

Figure 1:
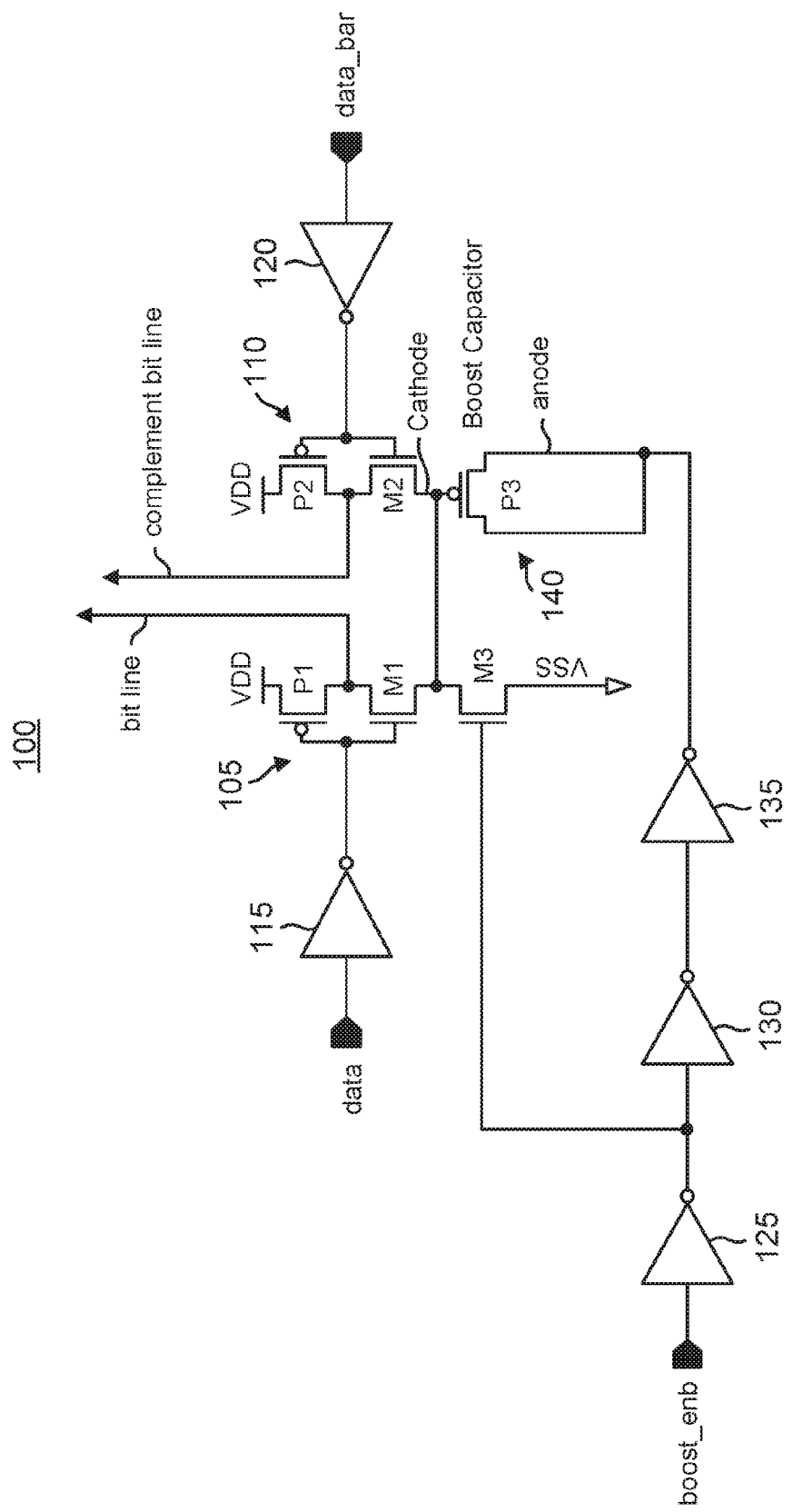
FIG. 1 is a circuit diagram of a conventional memory with negative bit line boost.
Figure 2:
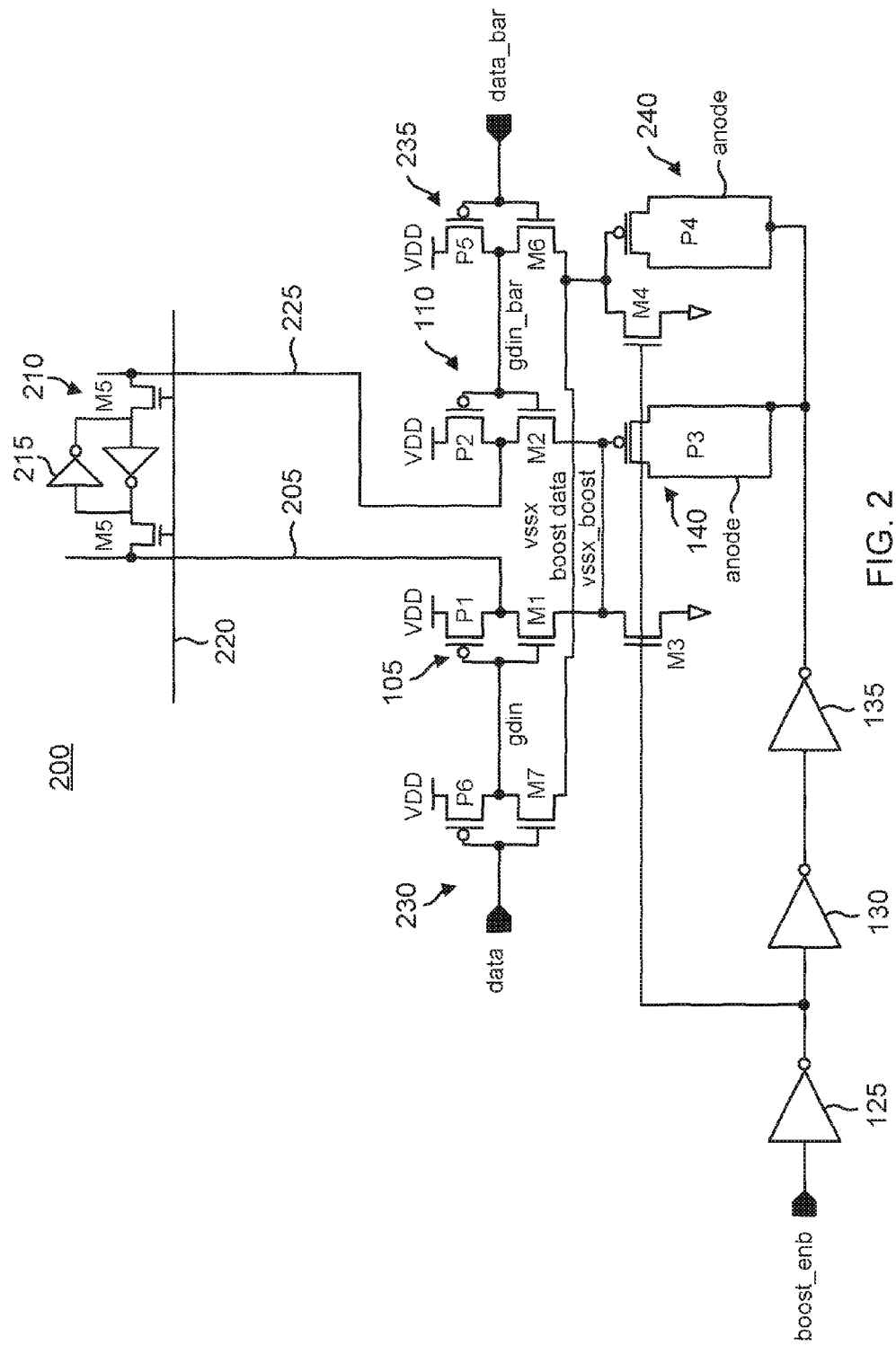
FIG. 2 is a circuit diagram of a memory with a negative bit line boost in which a boost ground node for a pair of write driver inverters also receives a negative boost through a separate boost capacitor in accordance with an aspect of the disclosure.

An example memory 200 is shown in FIG. 2. The first pair of write driver inverters are formed by write driver inverters 105 and 110 discussed with regard to FIG. 1. The second pair of write driver inverters are formed by a write driver inverter 230 and a write driver inverter 235. Write driver inverter 230 inverts a data bit input signal (data) to drive an input node gdin for write driver inverter 105. Thus, if the data bit input signal has a binary high value, input node gdin is grounded. Conversely, if the data bit input signal is grounded, input node gdin is charged to a power supply voltage VDD. An output of write driver inverter 105 drives a true bit line 205. As noted with regard to FIG. 1, write driver inverter 105 includes a PMOS transistor P1 having a source connected to a power supply voltage node supplying a power supply voltage VDD. A drain of transistor P1 connects to a drain of an NMOS transistor M1. The drain nodes for transistors P1 and M1 (the output node for inverter 105) are connected to true bit line 205. Similarly, the gates of transistors P1 and M1 form the input node gdin for write driver inverter 105. The source of transistor M1 connects to a first boost ground node vssx_boost that connects to a drain of NMOS write assist transistor M3 having a source connected to ground.

To ground first boost ground node vssx_boost, inverter 125 inverts a boost enable signal (boost_enb) to drive the gate of write assist transistor M3. In memory 200, the boost enable signal is active high such that it is a binary low value (ground) outside of the write assist period. Prior to the initiation of the write assist period, write assist transistor M3 is thus switched on to ground the first boost ground node vssx_boost. Should the data bit input signal have a binary low value, transistor M1 is also switched on prior to the write assist period such that true bit line 205 is discharged to ground through transistor M1 and write assist transistor M3. Conversely, if the data bit input signal is charged to the power supply voltage VDD, transistor P3 is switched on while transistor M1 is switched off to charge true bit line 205 to the power supply voltage VDD.

When the boost enable signal is asserted high, the output of inverter 125 goes low to switch off write assist transistor M3 to float the first boost ground node vssx_boost. As also discussed analogously with regard to FIG. 1, the output of inverter 125 is delayed through a pair of inverters 130 and 135 in series with inverter 125 to drive an anode of a first boost capacitor 140 formed by the gate capacitance of PMOS transistor P3 (both the drain and the source of transistor P3 are connected to the output of inverter 135 to form the anode of first boost capacitor 140). The gate of transistor P3 forms the cathode of first boost capacitor 140, which also forms the first boost ground node vssx_boost. Prior to the initiation of the write assist period, the anode of first boost capacitor 140 is charged to the power supply voltage VDD whereas the cathode of first boost capacitor 140 is discharged to ground. The assertion (as noted earlier, a signal is deemed herein to be "asserted" if it is charged high in the case of an active-high signal or discharged in the case of an active-low signal) of the boost enable signal causes inverter 135 to discharge the anode of first boost capacitor 140 (grounding the drain and source of transistor P3). The gate capacitance for transistor P3 then pulls its gate voltage below ground to provide a negative write assist voltage boost to the first boost ground node vssx_boost. Note that the delay through inverters 130 and 135 prevents the application of the negative boost while write assist transistor M3 is still on. In this fashion, write assist transistor M3 is off to float the first negative boost ground node vssx_boost prior to the negative boost from the first boost capacitor.

The driving of a complement bit line 225 is analogous to the driving of true bit line 205 (albeit in a complementary binary state). To drive complement bit line 225, write driver inverter 235 inverts a complement data bit input signal (data_bar) to drive the input node (gdin_bar) of write driver inverter 110, which is formed by PMOS transistor P2 in series with an NMOS transistor M2. The source of transistor P2 connects to the power supply node and its drain connects to the drain of transistor M2. The drains of transistors P2 and M2 form the output node for write driver inverter 110 and are connected to complement bit line 225. Similarly, the gates of transistors P2 and M2 form the input node gdin_bar of write driver inverter 110. The source of transistor M2 is tied to the first boost ground node vssx_boost. Should the complement data bit input signal be a binary zero, transistor M2 is switched on such that it grounds complement bit line 225 prior to the write assist period. This grounding then transforms to a negative boost during the write assist period. Conversely, transistor P2 is switched on while transistor M2 is switched off to charge complement bit line 225 if the complement data bit input signal is a binary one.

True bit line 205 and complement bit line 225 couple to various memory cells depending upon how many rows memory 200 includes (for illustration clarity, only a single memory cell 210 is shown in FIG. 2). Memory cell 210 includes a pair of cross-coupled inverters 215 (memory 200 being an SRAM). A word line 220 connects to the gates of a pair of access transistors (M5). When word line 220 is asserted, access transistors M5 are switched on to couple memory cell 210 to bit lines 205 and 225. A column multiplexer (not illustrated) may intervene between the outputs of write driver inverters 105 and 110 and bit lines 205 and 225 as known in the column multiplexing arts.

To prevent the leakage of boost charge during the write assist period, inverters 235 and 230 couple to ground through a second negative boost ground node vssx_boost_data that is given a negative boost by a second boost capacitor 240 such as formed by the gate capacitance of a PMOS transistor P4. In particular, inverter 230 includes a PMOS transistor P6 in series with an NMOS transistor M7. Similarly, inverter 235 includes a PMOS transistor P5 in series with an NMOS transistor M6. The sources of transistors M7 and M6 are tied to a second boost ground node vssx_boost_data that in turn is connected to the cathode for second boost capacitor 240 (the gate of transistor P4). In alternative embodiments, the various boost capacitors disclosed herein may be formed in the metal layers adjacent the semiconductor die. The drain and source of transistor P4 forms the anode for second boost capacitor 240, which is tied to the output of inverter 135. An NMOS write assist transistor M4 has its source tied to ground and its drain tied to the second boost ground node vssx_boost_data. Write assist transistor M4 is switched on prior to the initiation of the write assist period as discussed with regard to write assist transistor M3 to ground the second negative boost ground node vssx_boost_data. At the same time, inverter 135 charges the anode of second boost capacitor 240 to the power supply voltage VDD. At the initiation of the write assist period, the boost enable signal is asserted high, which causes the output of inverter 125 to be grounded so as to switch off write assist transistor M4. Following the delay through inverters 130 and 135, the anode of second boost capacitor 240 is grounded, such that the gate capacitance of transistor P4 causes the second boost ground node vssx_boost_data to be given a negative boost voltage.

This second negative boost voltage is quite advantageous in that it firmly shuts off the NMOS transistor in the write driver inverter in the first pair that would otherwise be weakly on during the write assist period. For example, suppose that the data bit input signal is false. Transistor P2 in write driver inverter 110 will then be on such that transistor M2 should be off during the write assist period. The source of transistor M2 will be given a negative boost through first boost ground node vssx_boost. But the gate of transistor M2 will also be given a negative boost through second boost ground node vssx_boost_data. The gate-to-source voltage for transistor M2 will thus be zero during the write assist period such that it stays firmly off when the data bit input signal is false. The same zero gate-to-source voltage is maintained for transistor M1 during the write assist period when the data bit input signal is true. There is thus virtually no leakage of boost charge through either of the transistors M1 and M2. Moreover, note that this second application of a negative boost does not affect the bit line negative boost since it comes from second boost capacitor 240 instead of from first boost capacitor 140. Accordingly, the strength of the negative bit line boost is considerably enhanced through the advantageous application of a second negative boost to the write driver inverters as disclosed herein.

Figure 3:
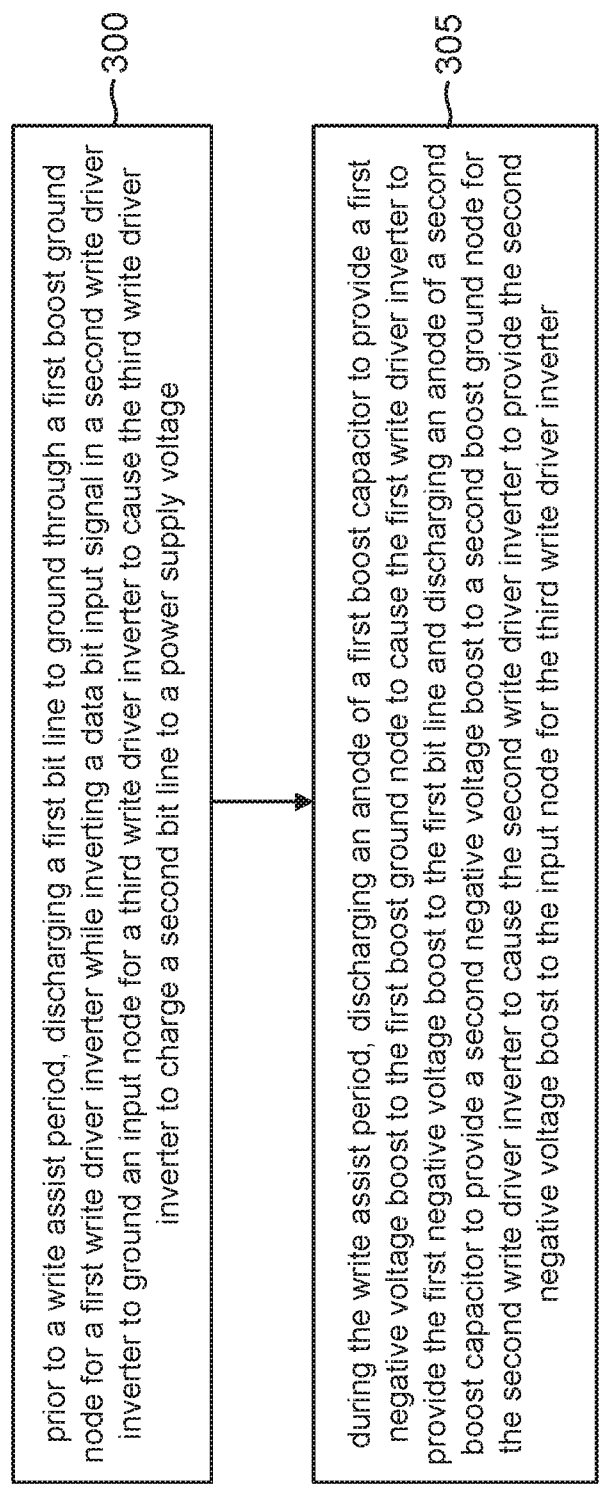
FIG. 3 is a flowchart for an example method of operation for the negative boosting of the write driver inverter boost ground node during the write assist period in accordance with an aspect of the disclosure.

In one embodiment, write assist transistors M3 and M4 in conjunction with inverters 125, 130, and 135 may be deemed to form a means for providing a first negative voltage boost from a first boost capacitor (140) to a first boost ground node (vssx_boost) for a first write driver inverter (110) during a write assist period and for providing a second negative voltage boost from a second boost capacitor (240) to a second ground node (vssx_boost_data) for a second write inverter (235) during the write assist period An example method of operation will now be discussed with regard to the flowchart of FIG. 3. The method includes an act 300 of, prior to a write assist period, discharging a first bit line to ground through a first boost ground node for a first write driver inverter while inverting a data bit input signal in a second write driver inverter to ground an input node for a third write driver inverter to cause the third write driver inverter to charge a second bit line to a power supply voltage. The discharge of true bit line 205 through first boost node vssx_boost while write driver inverter 110 charges complement bit line 225 is an example of act 300. The method also includes an act 305 of, during the write assist period, discharging an anode of a first boost capacitor to provide a first negative voltage boost to the first boost ground node to cause the first write driver inverter to provide the first negative voltage boost to the first bit line and discharging an anode of a second boost capacitor to provide a second negative voltage boost to a second boost ground node for the second write driver inverter to cause the second write driver inverter to provide the second negative voltage boost to the input node for the third write driver inverter. The discharging of the anodes for first boost capacitor 140 and second boost capacitor 240 to provide a negative boost to true bit line 205 and to the input node gdin_bar is an example of act 305.

As those of some skill in this art will by now appreciate and depending on the particular application at hand, many modifications, substitutions and variations can be made in and to the materials, apparatus, configurations and methods of use of the devices of the present disclosure without departing from the scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

We claim:

1. A memory comprising:
    a first write driver inverter including a first NMOS transistor, wherein a drain of the first NMOS transistor is connected to a bit line;
    a first boost capacitor configured to provide a first negative voltage boost to a source of the first NMOS transistor during a write assist period;
    a second write driver inverter including a second NMOS transistor, wherein the second write driver inverter is configured to invert a data bit input signal to drive an input node of the first write driver inverter; and a second boost capacitor configured to provide a second negative voltage boost to a source of the second NMOS transistor during the write assist period.

2. The memory of claim 1, further comprising:
a first write assist transistor configured to ground the source of the first NMOS transistor while a boost enable signal is not asserted.

3. The memory of claim 2, further comprising:
a second write assist transistor configured to ground the source of the second NMOS transistor while the boost enable signal is not asserted.

4. The memory of claim 1, further comprising a serial chain of inverters configured to delay and invert a boost enable signal into a delayed inverted boost signal, and wherein the serial chain of inverters are configured to discharge an anode of the first boost capacitor and to discharge an anode of the second boost capacitor responsive to an assertion of the boost enable signal.

5. The memory of claim 4, wherein the boost enable signal is a logic-high boost enable signal that is asserted to a power supply voltage.

6. The memory of claim 1, further comprising:
a third write driver inverter including a third NMOS transistor, wherein a drain of the third NMOS transistor is connected to a second bit line, wherein the second bit line is a complement of the first bit line, and wherein the first boost capacitor is further configured to provide the first negative voltage boost to a source of the third NMOS transistor during the write assist period; and
a fourth write driver inverter including a fourth NMOS transistor, wherein the fourth write driver inverter is configured to invert a complement data bit input signal to drive an input node of the third write driver inverter, wherein the second boost capacitor is further configured to provide the second negative voltage boost to a source of the second NMOS transistor during the write assist period.

7. The memory of claim 1, wherein the memory is a static random access memory (SRAM) further comprising a memory cell coupled to the first bit line through an access transistor, and wherein the memory cell includes a pair of cross-coupled inverters.

8. The memory of claim 1, wherein the first write inverter includes a first PMOS transistor in series with the first NMOS transistor, and wherein the second write inverter includes a second PMOS transistor in series with the second NMOS transistor.

9. The memory of claim 1, wherein the first boost capacitor comprises a gate capacitance for a first PMOS transistor.

10. The memory of claim 9, wherein the second boost capacitor comprises a gate capacitance for a second PMOS transistor.

11. A write assist method for a memory, the method comprising:
prior to a write assist period, discharging a first bit line to ground through a first boost ground node for a first write driver inverter while inverting a data bit input signal in a second write driver inverter to ground an input node for a third write driver inverter to cause the third write driver inverter to charge a second bit line to a power supply voltage; and
during the write assist period, discharging an anode of a first boost capacitor to provide a first negative voltage boost to the first boost ground node to cause the first write driver inverter to provide the first negative voltage boost to the first bit line and discharging an anode of a second boost capacitor to provide a second negative voltage boost to a second boost ground node for the second write driver inverter to cause the second write driver inverter to provide the second negative voltage boost to the input node for the third write driver inverter.

12. The write assist method of claim 11, further comprising:
prior to the write assist period, inverting a complement of the data bit input signal in a fourth write driver inverter to charge an input node for the first write driver inverter to the power supply voltage, wherein the first write driver inverter discharges the first bit line to ground responsive to the charging of its input node.

13. The write assist method of claim 11, further comprising:
prior to the write assist period, charging the anode of the first boost capacitor to the power supply voltage while discharging a cathode of the first boost capacitor to ground.

14. The write assist method of claim 11, further comprising:
prior to the write assist period, charging the anode of the second boost capacitor to the power supply voltage while discharging a cathode of the second boost capacitor to ground.

15. The write assist method of claim 11, wherein discharging the anode of the first boost capacitor and of the second boost capacitor is responsive to an assertion of a write assist enable signal.

16. The write assist method of claim 11, further comprising floating the first bit line prior to discharging the anode of the first boost capacitor.

17. The write assist method of claim 11, further comprising floating the second boost ground node prior to discharging the anode of the first boost capacitor.

* * * * *